United States Patent
Oono

(10) Patent No.: US 9,983,081 B2
(45) Date of Patent: May 29, 2018

(54) PRESSURE SENSOR

(71) Applicant: DENSO CORPORATION, Kariya, Aichi-pref. (JP)

(72) Inventor: Kazuyuki Oono, Kariya (JP)

(73) Assignee: DENSO CORPORATION, Kariya (JP)

( * ) Notice: Subject to any disclaimer, the term of this patent is extended or adjusted under 35 U.S.C. 154(b) by 166 days.

(21) Appl. No.: 15/111,494

(22) PCT Filed: Feb. 27, 2015

(86) PCT No.: PCT/JP2015/001017
§ 371 (c)(1),
(2) Date: Jul. 14, 2016

(87) PCT Pub. No.: WO2015/133101
PCT Pub. Date: Sep. 11, 2015

(65) Prior Publication Data
US 2016/0334292 A1    Nov. 17, 2016

(30) Foreign Application Priority Data
Mar. 3, 2014    (JP) .................... 2014-040485

(51) Int. Cl.
*G01L 9/04* (2006.01)
*G01L 9/06* (2006.01)
(Continued)

(52) U.S. Cl.
CPC .............. *G01L 13/026* (2013.01); *G01L 9/00* (2013.01); *G01L 9/0041* (2013.01); *G01L 19/14* (2013.01); *H01L 29/84* (2013.01)

(58) Field of Classification Search
CPC . G01L 9/00; G01L 9/0041; G01L 9/04; G01L 9/06; G01L 9/08; G01L 13/02;
(Continued)

(56) References Cited

U.S. PATENT DOCUMENTS 4,790,192 A      12/1988  Knecht et al.
2011/0209553 A1*  9/2011  Crivelli .................. G01L 9/0052
                                                                73/721

FOREIGN PATENT DOCUMENTS

EP    2362203 A2 *  8/2011  .......... G01L 9/0052
JP    H04-047244 A    2/1992
(Continued)

*Primary Examiner* — Nguyen Ha
(74) *Attorney, Agent, or Firm* — Posz Law Group, PLC

(57) ABSTRACT

A pressure sensor includes: a first substrate having first and second diaphragms on one surface provided by first and second recesses on another surface; first and second detecting elements on the first and second diaphragms; a second substrate providing a first reference pressure chamber with the one surface of the first substrate; a third substrate providing a second reference pressure chamber sealing the second recess; and a calculator calculating an offset value by a difference between a reference signal and an inspection signal and detecting a pressure of a measurement medium by a difference between a detection signal and the offset value. The first detecting element outputs the detection signal or the inspection signal according to a pressure difference between a first reference pressure or a reference medium pressure and a measurement medium pressure in the first recess. The second detecting element outputs the reference signal according to a difference between the first reference pressure and and a second reference pressure.

3 Claims, 4 Drawing Sheets

(51) Int. Cl.
    *G01L 13/02*     (2006.01)
    *G01L 19/04*     (2006.01)
    *G01L 19/14*     (2006.01)
    *G01L 9/00*     (2006.01)
    *H01L 29/84*     (2006.01)

(58) Field of Classification Search
    CPC ....... G01L 13/026; G01L 19/04; G01L 19/14; H01L 29/84
    See application file for complete search history.

(56) References Cited

FOREIGN PATENT DOCUMENTS

| JP | H05-036992 A | 2/1993 |
|---|---|---|
| JP | 2006-071501 A | 3/2006 |
| JP | 2010-151469 A | 7/2010 |
| JP | 2011-191273 A | 9/2011 |

\* cited by examiner

PRESSURE SENSOR

CROSS REFERENCE TO RELATED APPLICATION

This application is a U.S. national stage of International Application No. PCT/JP2015/001017 filed on Feb. 27, 2015 and is based on Japanese Patent Application No. 2014-40485 filed on Mar. 3, 2014, the disclosures of which are incorporated herein by reference.

TECHNICAL FIELD

The present disclosure relates to a pressure sensor configured to detect pressure of a measurement medium in accordance with deformation of a diaphragm.

BACKGROUND ART

As a pressure sensor of this type, there has been conventionally proposed a pressure sensor including a cap disposed on a substrate provided with a diaphragm (see Patent Literature 1, for example).

Specifically, in this pressure sensor, the substrate having a first surface and a second surface is provided, in the second surface, with a recess. The diaphragm is provided between the bottom surface of the recess and the first surface of the substrate. The diaphragm has a first surface provided with a plurality of gauge resistors so as to configure a bridge circuit. The cap is disposed on the first surface of the substrate such that the gauge resistors are sealed and a reference pressure chamber is provided between the cap and the first surface of the substrate.

When a measurement medium is introduced to the recess provided in the substrate of the pressure sensor thus configured, the diaphragm is deformed in accordance with differential pressure between pressure of the measurement medium and pressure in the reference pressure chamber. The gauge resistors provided on the diaphragm are deformed to cause variation in output voltage of the bridge circuit and cause output of a sensor signal according to the differential pressure.

However, in the pressure sensor, foreign matter in the measurement medium possibly adheres to a portion of the diaphragm exposed to the measurement medium. The foreign matter adhering to this portion reduces pressure applied to the diaphragm so as to be lower than actual pressure of the measurement medium. In other words, the foreign matter restrains deformation of the diaphragm. The pressure sensor thus has a problem that detection accuracy deteriorates if foreign matter adheres to the portion of the diaphragm exposed to the measurement medium.

PRIOR ART LITERATURES

Patent Literature

Patent Literature 1: JP-2010-151469-A

SUMMARY OF INVENTION

It is an object of the present disclosure to provide a pressure sensor configured to restrain deterioration in detection accuracy.

According to an aspect of the present disclosure, a pressure sensor includes: a first substrate having one surface and an other surface opposite to the one surface, and including a first diaphragm on the one surface provided by a first recess on the other surface; a first detecting element arranged in the first diaphragm on the one surface; and a second substrate arranged on the one surface of the first substrate, and providing a first reference pressure chamber that is arranged between the first substrate and the second substrate and applies first reference pressure to the one surface of the first diaphragm. The first detection element outputs a detection signal according to pressure difference between pressure of a measurement medium introduced to the first recess and the first reference pressure in the first reference pressure chamber. The first substrate includes a second diaphragm on the one surface provided by a second recess on the other surface. The first reference pressure chamber applies the first reference pressure to the one surface of the second diaphragm together with the one surface of the first diaphragm. The pressure sensor further includes: a third substrate attached to the other surface of the first substrate, and including a second reference pressure chamber that seals the second recess and applies second reference pressure to the other surface of the second diaphragm; a second detecting element arranged in the second diaphragm on the one surface, and outputs a reference signal according to pressure difference between the first reference pressure in the first reference pressure chamber and the second reference pressure in the second reference pressure chamber; and a calculator calculating an offset value by calculating a differential value between the reference signal and an inspection signal outputted from the first detecting element in accordance with pressure difference between the first reference pressure in the first reference pressure chamber and pressure of a reference medium different from the pressure of the measurement medium to be introduced to the first recess, and detecting the pressure of the measurement medium in accordance with a differential value between the detection signal and the offset value.

Even in a case where foreign matter adheres to the first diaphragm, the pressure sensor cancels any influence of the foreign matter by the calculation of the differential value between the detection signal and the offset value, and thus restrains deterioration in detection accuracy.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

First Embodiment

The first embodiment of the present disclosure will now be described. A pressure sensor according to the present embodiment is preferred to be mounted on an automobile and be used as a pressure sensor configured to detect pressure of oil discharged from an oil pump.

Figure 1:
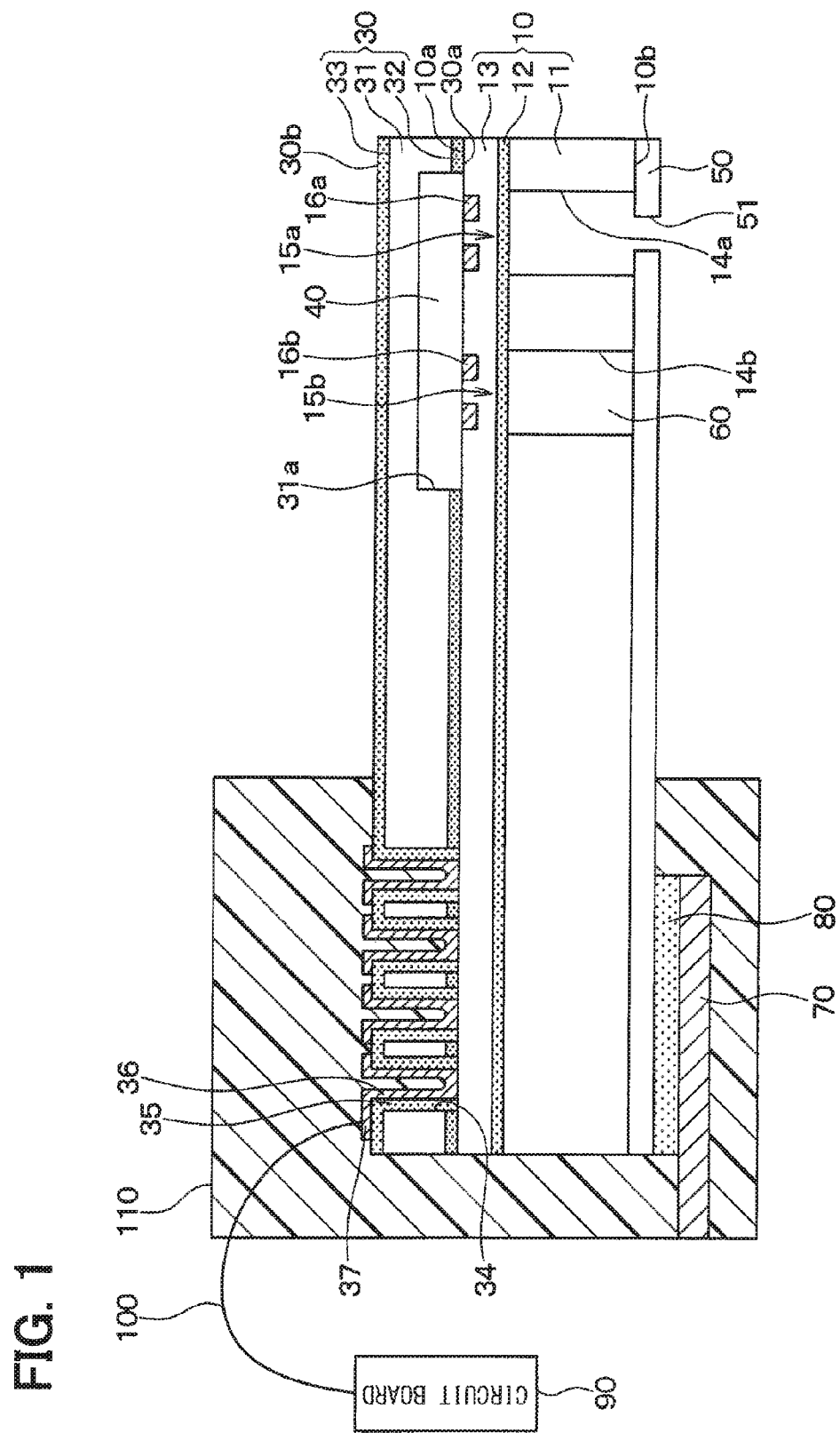
FIG. 1 is a partial sectional view of a pressure sensor according to a first embodiment of the present disclosure.
Figure 2:
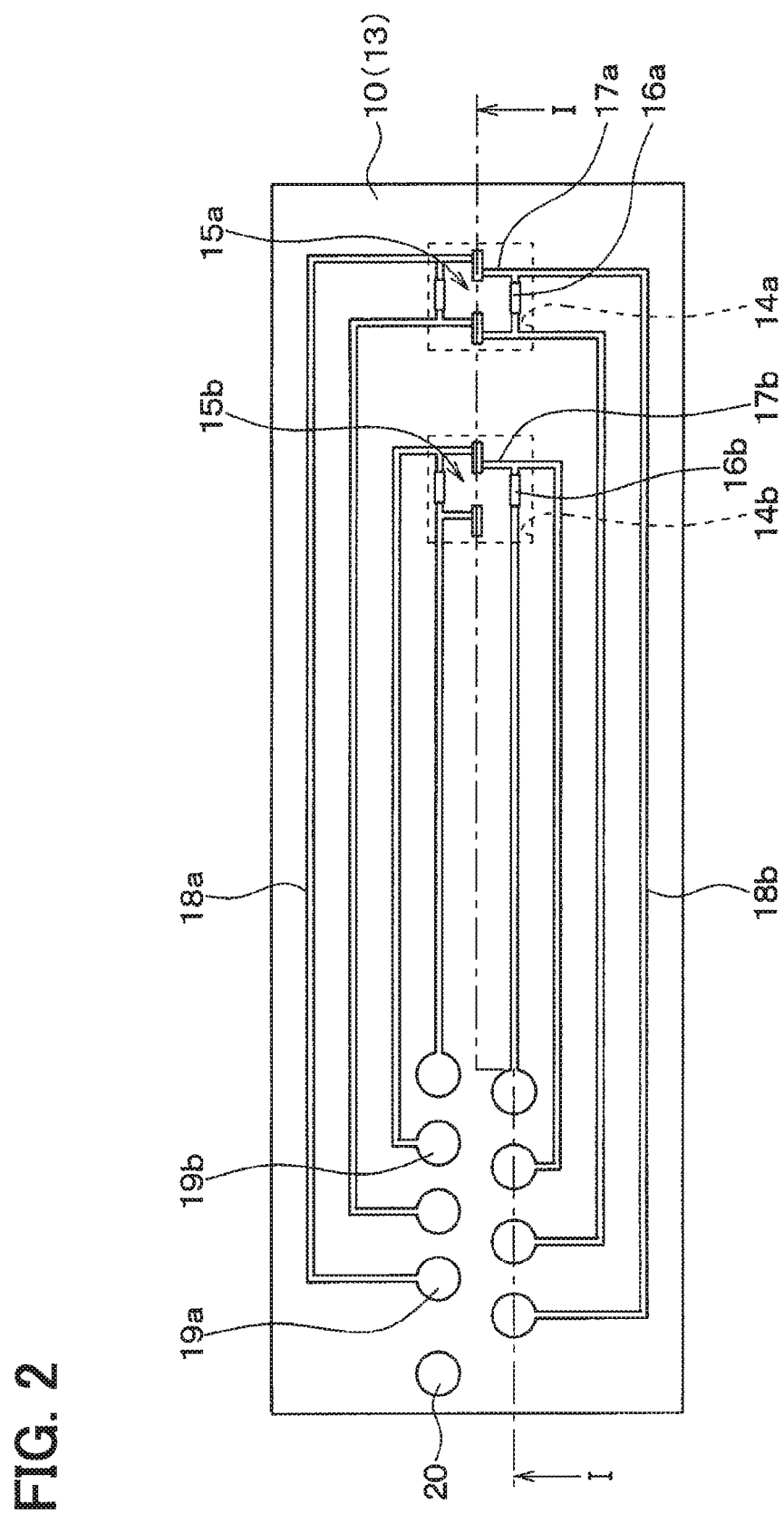
FIG. 2 is a plan view of a first substrate illustrated in FIG. 1.

As illustrated in FIGS. 1 and 2, the pressure sensor includes a first substrate 10 having a first surface 10a and a second surface 10b opposite to the first surface 10a. The first substrate 10 according to the present embodiment includes a support substrate 11, an insulating film 12, and a semiconductor layer 13 that are laminated in the mentioned order. The first substrate 10 is configured by a silicon on insulator (SOI) substrate (semiconductor substrate) having a rectangular shape in a planar view with a side in a longitudinal direction. The semiconductor layer 13 has a surface, not in contact with the insulating film 12, configuring the first surface 10a of the first substrate 10, whereas the support substrate 11 has a surface, not in contact with the insulating film 12, configuring the second surface 10b of the first substrate 10.

The semiconductor layer 13 according to the present embodiment is made of N-type silicon. FIG. 1 is a sectional view of the first substrate 10 and the like, and the section corresponds to an I-I section indicated in FIG. 2.

The first substrate 10 has first and second recesses 14a and 14b that are provided in the second surface 10b at a first end in the longitudinal direction (on the right side of the sheets of FIGS. 1 and 2), so as to provide first and second diaphragms 15a and 15b configured to be deformed in accordance with pressure.

The first and second recesses 14a and 14b according to the present embodiment are provided to extend from the second surface 10b of the first substrate 10 to the insulating film 12. The first and second diaphragms 15a and 15b are configured by the insulating film 12 and the semiconductor layer 13 positioned between bottom surfaces of the first and second recesses 14a and 14b and the first surface 10a of the first substrate 10.

The first recess 14a is provided closer to the first end than the second recess 14b is. In other words, the first diaphragm 15a is provided closer to the first end of the first substrate 10 than the second diaphragm 15b is.

The first and second diaphragms 15a and 15b have identical shapes. Specifically, the first and second diaphragms 15a and 15b are equal in plane area as well as in thickness. The first and second diaphragms 15a and 15b according to the present embodiment each have a rectangular shape in a planar view, although not particularly limited thereto.

The first and second diaphragms 15a and 15b are provided with first and second gauge resistors 16a and 16b having resistance values varied in accordance with deformation of the first and second diaphragms 15a and 15b, respectively. According to the present embodiment, P-type impurities are diffused to form four first gauge resistors 16a and four second gauge resistors 16b. The first and second gauge resistors 16a and 16b are appropriately connected by first and second connecting wire layers 17a and 17b so as to configure a bridge circuit.

The first and second gauge resistors 16a and 16b according to the present embodiment provided to configure the bridge circuit correspond to first and second detecting elements according to the present disclosure.

The first substrate 10 is also provided with first and second lead wire layers 18a and 18b that are electrically connected to the first and second gauge resistors 16a and 16b. The first and second lead wire layers 18a and 18b are led out from portions connected with the first and second gauge resistors 16a and 16b to a second end (on the left side of the sheets of FIGS. 1 and 2) of the first substrate 10.

The number of each of the first and second lead wire layers 18a and 18b is four in the present embodiment. These four first or second lead wire layers 18a or 18b include a wire layer configured to apply power supply voltage, a wire layer connected with ground potential, and two wire layers configured to output middle point voltage of the bridge circuit.

The first and second lead wire layers 18a and 18b have ends opposite to the portions connected with the first and second gauge resistors 16a and 16b, and the ends are provided with first and second connections 19a and 19b connected with the first and second lead wire layers 18a and 18b. The first and second connections 19a and 19b are electrically connected with a through electrode 36 to be described later, and each have a circular shape in a planar view in the present embodiment.

The first and second connecting wire layers 17a and 17b, the first and second lead wire layers 18a and 18b, and the first and second connections 19a and 19b are each provided as a diffusion layer containing diffused P-type impurities, for example.

The first substrate 10 has an $n^+$-type contact layer 20 that is provided closer to the second end than to the first and second connections 19a and 19b and has a higher impurity concentration than that of the semiconductor layer 13. This contact layer 20 is connected with the through electrode 36 to be described later and is configured to keep predetermined potential of the semiconductor layer 13.

As illustrated in FIG. 1, the first substrate 10 is provided, on the first surface 10a, with a second substrate 30. The second substrate 30 includes a substrate 31 made of silicon or the like and having a first surface that faces the first substrate 10 and that is provided thereon with an insulating film 32. The substrate 31 has a second surface that is opposite to the first surface and is provided thereon with an insulating film 33. The insulating film 32 is joined to the first substrate 10 (semiconductor layer 13).

According to the present embodiment, the insulating film 32 and the first substrate 10 (semiconductor layer 13) are joined to each other by the so-called direct joining or the like of activating a joint surface of either the insulating film 32 or the semiconductor layer 13 and joining the insulating film 32 and the semiconductor layer 13. In the following description, assume that the insulating film 32 has a first surface that is not in contact with the substrate 31 and is contact with a first surface 30a of the second substrate 30, as well as that the insulating film 33 has a first surface that is not in contact with the substrate 31 and is in contact with a second surface 30b of the second substrate 30.

The substrate 31 has a depression 31a that faces the first and second diaphragms 15a and 15b. The depression 31a configures a common first reference pressure chamber 40 provided between the first substrate 10 and the second substrate 30. The first and second diaphragms 15a and 15b have ends that are in contact with the first surface 10a and are sealed by the common first reference pressure chamber 10. In this configuration, the first reference pressure chamber 40 applies common first reference pressure to the ends of the first and second diaphragms 15a and 15b on the first surface 10a.

FIG. 1 illustrates a state where the insulating film 32 is not provided on a wall surface of the depression 31a. Alternatively, the wall surface of the depression 31a is provided with the insulating film 32. Furthermore, the first reference pressure chamber 40 according to the present embodiment has vacuum pressure.

The second substrate 30 is provided, at a second end (on the left side of the sheet of FIG. 1), with nine through holes 34 that penetrate the second substrate 30 in the direction in which the first substrate 10 and the second substrate 30 are laminated. Specifically, these through holes 34 are provided to expose the first and second connections 19a and 19b as well as the contact layer 20. The through holes 34 each have a wall surface provided with an insulating film 35 that is made of tetra ethyl ortho silicate (TEOS) or the like. The insulating film 35 is provided thereon with the through electrode 36 that is made of aluminum or the like and is appropriately electrically connected to the first and second connections 19a and 19b as well as to the contact layer 20. The insulating film 33 is provided thereon with a pad 37 that is in contact with the second surface 30b of the second substrate 30 and is electrically connected to the through electrode 36.

FIG. 1 illustrates only the pad 37 electrically connected to the through electrode 36 positioned at the leftmost end on the sheet. There is provided another through electrode 36 that is electrically connected to another pad 37 provided on a section different from the section illustrated in FIG. 1.

The first substrate 10 is provided, on the second surface 10b, with a third substrate 50 of a silicon substrate or the like. The third substrate 50 is disposed to close the second recess 14b. According to the present embodiment, the first substrate 10 and the third substrate 50 are joined to each other by the so-called direct joining or the like, similarly to the joining between the first substrate 10 and the second substrate 30.

The third substrate 50 is provided with a through hole 51 causing a space in the first recess 14a and an external space to communicate with each other. Accordingly, a measurement medium to be detected is introduced from the external space to the interior of the first recess 14a.

The first diaphragm 15a is deformed in accordance with differential pressure between pressure in the first recess 14a and the first reference pressure in the first reference pressure chamber 40. The first gauge resistor 16a provided at the first diaphragm 15a is deformed to cause variation in output voltage of the bridge circuit and cause output of a detection signal responsive to the differential pressure.

The measurement medium is introduced to the first recess 14a as described above. A reference medium (atmosphere) is introduced thereto before introduction of the measurement medium. In a case where the pressure sensor is mounted on an automobile and is configured to detect pressure of oil, the reference medium is introduced to the first recess 14a from before an ignition switch is turned ON to immediately after the ignition switch is turned ON. The measurement medium is introduced after a predetermined period from timing when the ignition switch is turned ON. In the case where the reference medium is introduced to the first recess 14a, there is outputted an inspection signal according to differential pressure between pressure of the reference medium and the first reference pressure in the first reference pressure chamber 40.

The second recess 14b is closed by the third substrate 50. The space in the second recess 14b configures a second reference pressure chamber 60 provided between the first substrate 10 and the third substrate 50. Second reference pressure of the second reference pressure chamber 60 is applied to an end of the second diaphragm 15b close to the second surface 10b. The second reference pressure chamber 60 according to the present embodiment has vacuum pressure.

The second diaphragm 15b is deformed in accordance with differential pressure between the first reference pressure in the first reference pressure chamber 40 and the second reference pressure in the second reference pressure chamber 60. The second gauge resistor 16b provided at the second diaphragm 15b is deformed to cause variation in output voltage of the bridge circuit and cause output of a reference signal according to the differential pressure.

The third substrate 50 is provided, on a second end (on the left side of the sheet of FIG. 1), with a support member 70 supporting the first, second, and third substrates 10, 30, and 50 mounted thereon. There is provided a joint member 80 such as an adhesive agent, between the third substrate 50 and the support member 70. This support member 70 is configured as a lead frame made of copper, 42 alloy, or the like.

The pads 37 provided on the second substrate 30 are electrically connected, via a bonding wire 100, with a circuit board 90 configured to process signals in a predetermined manner, and the like. The circuit board 90 is configured to calculate an offset value from a differential value between an inspection signal and a reference signal and detect pressure in accordance with a differential value between a detection signal and the offset value. In other words, the circuit board 90 is configured to correct the detection signal in accordance with the offset value and detect pressure. The circuit board 90 according to the present embodiment corresponds to a calculator according to the present disclosure.

The second ends of the first, second, and third substrates 10, 30, and 50, the bonding wire 100, the support member 70, and the like are sealed and fixed by mold resin 110. In other words, each of the first, second, and third substrates 10, 30, and 50 has the free first end and the fixed second end.

The configuration of the pressure sensor according to the present embodiment has been described above. Operation of the pressure sensor will now be described next. The pressure sensor configured as described above is mounted on an automobile or the like and is used to detect pressure of oil discharged from an oil pump. The pressure sensor detects pressure in a state where the N-type semiconductor layer 13 (contact layer 20) has higher potential than that of the P-type portions, namely, the first and second gauge resistors 16a and 16b, the first and second connecting wire layers 17a and 17b, the first and second lead wire layers 18a and 18b, and the first and second connections 19a and 19b. Specifically, the pressure sensor detects pressure in a state where reverse bias is applied to a diode including the N-type semiconductor layer 13 and the P-type portions, namely, the first and second gauge resistors 16a and 16b, the first and second connecting wire layers 17a and 17b, the first and second lead wire layers 18a and 18b, and the first and second connections 19a and 19b.

Immediately after the ignition switch is turned ON, for example, the circuit board 90 initially calculates a differential value between an inspection signal and a reference signal to obtain an offset value. In other words, the circuit board 90 calculates the offset value in a state where the reference medium such as atmosphere is applied to the first recess 14a.

Figure 3A:
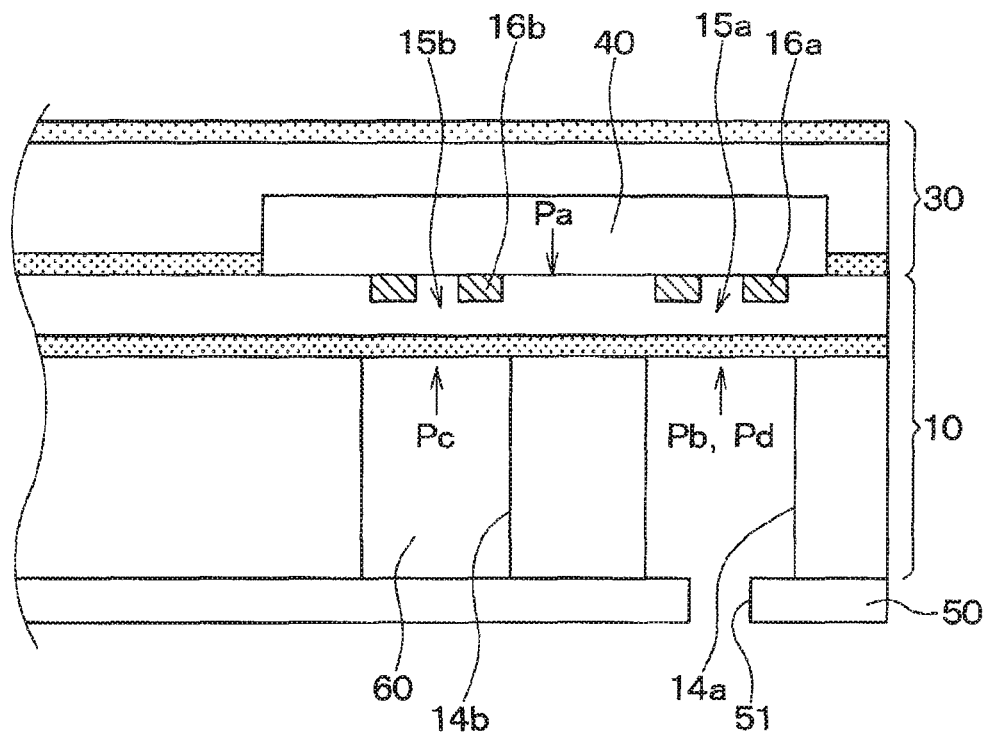
FIG. 3A is a schematic view indicating pressure applied to first and second diaphragms.

For example, as illustrated in FIG. 3A, assume that first reference pressure Pa is applied from the first reference pressure chamber 40 to the first and second diaphragms 15a and 15b, and pressure Pb is applied from the reference medium to the first diaphragm 15a. Furthermore, assume that second reference pressure Pc is applied from the second reference pressure chamber 60 to the second diaphragm 15b. In this case, an inspection signal according to differential pressure between the pressure Pb of the reference medium and the first reference pressure Pa corresponds to a signal according to Pb−Pa. A reference signal according to differential pressure between the second reference pressure Pc and the first reference pressure Pa corresponds to a signal according to Pc−Pa. An offset value as a differential value between the inspection signal Pb−Pa and the reference signal Pc−Pa corresponds to a signal according to Pb−Pc.

If the measurement medium is introduced to the first recess 14a after the ignition switch is turned ON, the circuit board 90 calculates a differential value between the detection signal and the offset value to detect pressure.

Assuming that the measurement medium has pressure Pd, a detection signal according to differential pressure between the pressure Pd of the measurement medium and the first reference pressure Pa corresponds to a signal according to Pd−Pa. The circuit board 90 thus detects pressure in accordance with a differential value Pd−Pa−Pb+Pc between the detection signal Pd−Pa and the offset value Pb−Pc.

Figure 3B:
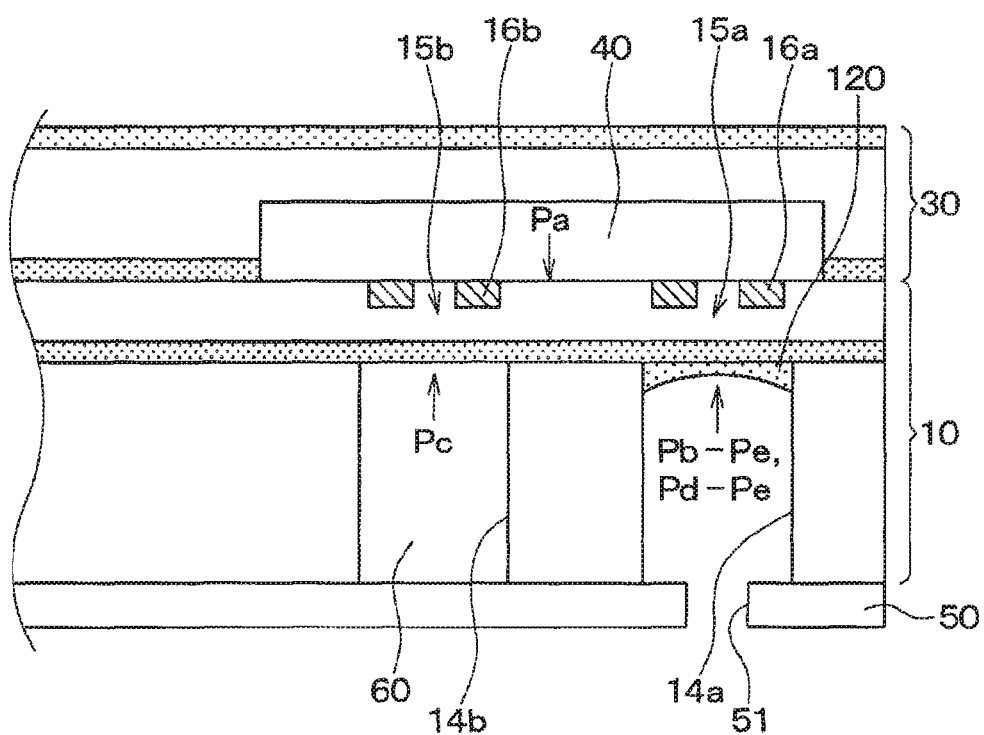
FIG. 3B is a schematic view indicating pressure applied to the first and second diaphragms in a case where foreign matter adheres to the first diaphragm.

As illustrated in FIG. 3B, when foreign matter 120 such as oil deteriorating matter adheres to a portion of the first diaphragm 15a exposed to the measurement medium, the foreign matter 120 reduces pressure applied to the first diaphragm 15a so as to be lower than actual pressure of the measurement medium.

Assuming that pressure Pe is reduced by the foreign matter, the inspection signal corresponds to a signal according to (Pb−Pe)−Pa. An offset value as a differential value between the inspection signal (Pb−Pe)−Pa and the reference signal Pc−Pa corresponds to a signal according to (Pb−Pe)−Pc. The foreign matter 120 affects the reference medium as well as the measurement medium. The detection signal thus corresponds to a signal according to (Pd−Pe)−Pa.

The circuit board 90 then calculates the differential value Pd−Pa−Pb+Pc between the detection signal (Pd−Pe)−Pa and the offset value (Pb−Pe)−Pc and detects pressure in accordance with the differential value Pd−Pa−Pb+Pc. The pressure Pe reduced by the foreign matter 120 is thus cancelled to enable pressure detection similar to that in a case where no foreign matter 120 adheres to the first diaphragm 15a.

The above description exemplifies the case with the first reference pressure Pa and the second reference pressure Pc. Alternatively, the first reference pressure and the second reference pressure are equal to each other.

As described above, the present embodiment includes calculation of an offset value from a differential value between an inspection signal and a reference signal, and detection of pressure according to a differential value between a detection signal and the offset value.

Even in a case where the foreign matter 120 adheres to the first diaphragm 15a, any influence of the foreign matter is canceled to restrain deterioration in detection accuracy. The first diaphragm 15a is provided closer to the first end of the first substrate 10 than the second diaphragm 15b is. In other words, the first diaphragm 15a is provided closer to the free end than the second diaphragm 15b is. This configuration restrains thermal stress generated between the mold resin 110 and the first, second, and third substrates 10, 30, and 50 from being applied to the first diaphragm 15a to which the measurement medium is actually applied.

Second Embodiment

The second embodiment of the present disclosure will now be described. The present embodiment is similar to the first embodiment except that the configuration of the third substrate 50 is modified from that of the first embodiment. Accordingly, common features will not be described herein.

Figure 4:
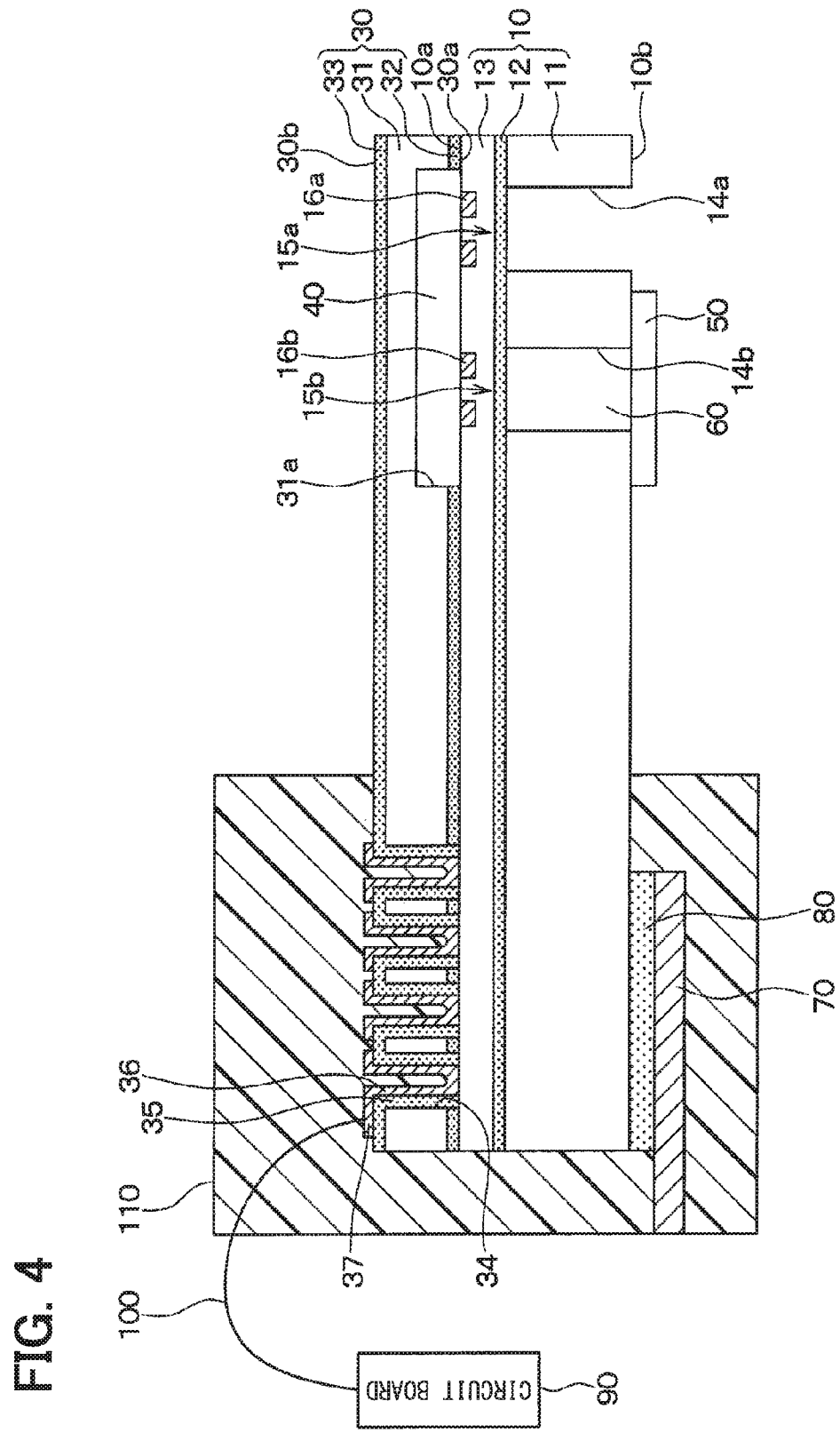
FIG. 4 is a partial sectional view of a pressure sensor according to a second embodiment of the present disclosure.

As illustrated in FIG. 4, the third substrate 50 according to the present embodiment is provided only around an opening of the second recess 14b in the second surface 10b of the first substrate 10. Portions in the second surface 10b of the first substrate 10 other than the periphery of the opening of the second recess 14b are thus exposed from the third substrate 50. The support member 70 is connected with the first substrate 10 via the joint member 80.

The present embodiment achieves effects similar to those according to the first embodiment with the reduced third substrate 50.

Other Embodiments

For example, the first substrate 10 according to each of the embodiments described above is alternately configured by a silicon substrate or the like in place of the SOI substrate.

In each of the above embodiments, the first diaphragm 15a is alternatively provided closer to the second end (fixed end) than the second diaphragm 15b is. Such a pressure sensor is also configured to calculate an offset value from a differential value between an inspection signal and a reference signal and detect pressure in accordance with a differential value between a detection signal and the offset value as described above, thereby restraining deterioration in detection accuracy.

In each of the above embodiments, the first and second diaphragms 15a and 15b are alternatively configured only by the semiconductor layer 13. In other words, the insulating film 12 is optionally removed by the first and second recesses 14a and 14b.

In each of the above embodiments, alternatively, the semiconductor layer 13 and the contact layer 20 are of the P-type, whereas the first and second gauge resistors 16a and 16b, the first and second connecting wire layers 17a and 17b, the first and second lead wire layers 18a and 18b, and the first and second connections 19a and 19b are of the N-type. In this case, pressure will be detected in a state where the first and second gauge resistors 16a and 16b, the first and second connecting wire layers 17a and 17b, the first and second lead wire layers 18a and 18b, and the first and second connections 19a and 19b have higher potential than that of the semiconductor layer 13.

In each of the above embodiments, the first and second lead wire layers 18a and 18b configured to apply power supply voltage to the first and second gauge resistors 16a and 16b, and the first and second lead wire layers 18a and 18b configured to apply ground potential thereto are alternatively provided in common. Specifically, there are provided seven through holes 34 (through electrodes 36) in this case. This configuration achieves reduction in number of the through holes 34 (through electrodes 36) so as to reduce regions to provide these components and enable reduction in size.

In each of the above embodiments, the first and second diaphragms 15a and 15b alternatively have different shapes. In each of the above embodiments, the first and second connections 19a and 19b and the contact layer 20 alternatively have rectangular shapes, polygonal shapes, or the like instead of the circular shapes in a planar view.

In each of the above embodiments, joining between the first and second substrates 10 and 30 and joining between the first and third substrates 10 and 50 are alternatively made in accordance with a joint technique such as anodic bonding, intermediate layer joining, or fusion joining. Still alternatively, processing such as high temperature annealing is executed for improvement in joint quality.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A pressure sensor comprising:
a first substrate having one surface and an other surface opposite to the one surface, and including a first diaphragm on the one surface provided by a first recess on the other surface;
a first detecting element arranged in the first diaphragm on the one surface; and
a second substrate arranged on the one surface of the first substrate, and providing a first reference pressure chamber that is arranged between the first substrate and the second substrate and applies first reference pressure to the one surface of the first diaphragm, wherein:
the first detection element outputs a detection signal according to pressure difference between pressure of a measurement medium introduced to the first recess and the first reference pressure in the first reference pressure chamber;
the first substrate includes a second diaphragm on the one surface provided by a second recess on the other surface; and
the first reference pressure chamber applies the first reference pressure to the one surface of the second diaphragm together with the one surface of the first diaphragm;
the pressure sensor further comprising:
a third substrate attached to the other surface of the first substrate, and including a second reference pressure chamber that seals the second recess and applies second reference pressure to the other surface of the second diaphragm;
a second detecting element arranged in the second diaphragm on the one surface, and outputs a reference signal according to pressure difference between the first reference pressure in the first reference pressure chamber and the second reference pressure in the second reference pressure chamber; and
a calculator calculating an offset value by calculating a differential value between the reference signal and an inspection signal outputted from the first detecting element in accordance with pressure difference between the first reference pressure in the first reference pressure chamber and pressure of a reference medium different from the pressure of the measurement medium to be introduced to the first recess, and detecting the pressure of the measurement medium in accordance with a differential value between the detection signal and the offset value, wherein:
when the first substrate has one direction as a longitudinal direction, the first substrate has one end in the longitudinal direction as a fixed end sealed by mold resin, and an other end in the longitudinal direction as a free end; and
the first diaphragm is arranged closer to the free end than the second diaphragm.

2. The pressure sensor according to claim 1, wherein:
the third substrate is arranged around an opening of the second recess on the other surface of the first substrate.

3. The pressure sensor according to claim 1, wherein:
the first substrate is a semiconductor substrate including a support substrate, an insulating film, and a semiconductor layer, which are stacked in an order thereof; and
the semiconductor layer is arranged on the one surface of the first substrate, and the support substrate is arranged on the other surface of the first substrate.

* * * * *